US012593408B2

(12) United States Patent     (10) Patent No.:   US 12,593,408 B2
Choi et al.       (45) Date of Patent:    Mar. 31, 2026

(54) PACKAGE SUBSTRATE HAVING EMBEDDED ELECTRONIC COMPONENT IN A CORE OF THE PACKAGE SUBSTRATE

(71) Applicant: QUALCOMM Incorporated, San Diego, CA (US)

(72) Inventors: Seongryul Choi, Seongnam (KR); Kuiwon Kang, San Diego, CA (US); Jung Won Park, Gumi (KR)

(73) Assignee: QUALCOMM INCORPORATED, San Diego, CA (US)

( * ) Notice: Subject to any disclaimer, the term of this patent is extended or adjusted under 35 U.S.C. 154(b) by 66 days.

(21) Appl. No.: 18/310,408

(22) Filed: May 1, 2023

(65) Prior Publication Data

US 2024/0373562 A1    Nov. 7, 2024

(51) Int. Cl.
| | |
|---|---|
| *H05K 1/18* | (2006.01) |
| *H05K 1/11* | (2006.01) |
| *H05K 1/185* | (2026.01) |
| *H05K 3/32* | (2006.01) |
| *H05K 3/40* | (2006.01) |

(52) U.S. Cl.
CPC ............ *H05K 1/186* (2013.01); *H05K 1/115* (2013.01); *H05K 3/32* (2013.01); *H05K 3/4053* (2013.01); *H05K 2201/0195* (2013.01); *H05K 2201/10015* (2013.01)

(58) Field of Classification Search
CPC ............ H05K 1/18–186; H05K 1/115; H05K 2201/0195; H05K 2201/10015; H01L 21/4846; H01L 23/13; H01L 23/49822
See application file for complete search history.

(56) References Cited

U.S. PATENT DOCUMENTS

| | | | |
|---|---|---|---|
| 2003/0102572 A1* | 6/2003 | Nathan | .................. H05K 1/185 257/E29.022 |
| 2005/0211465 A1* | 9/2005 | Sunohara | ............ H01L 23/5389 361/764 |
| 2007/0074900 A1 | 4/2007 | Lee et al. | |

(Continued)

FOREIGN PATENT DOCUMENTS

| | | |
|---|---|---|
| EP | 3474639 A1 | 4/2019 |

OTHER PUBLICATIONS

International Search Report and Written Opinion—PCT/US2024/024979—ISA/EPO—Sep. 4, 2024.

*Primary Examiner* — Roshn K Varghese
(74) *Attorney, Agent, or Firm* — Muncy, Geissler, Olds & Lowe, P.C.

(57) ABSTRACT

In an aspect, an electronic device is disclosed that includes a core having an upper planar surface and an interior planar surface; a cavity extending at least partially through the upper planar surface of the core to the interior planar surface of the core; an electronic component mounted in the cavity, the electronic component including an upper planar surface having one or more electronic component terminals, wherein the electronic component is supported by the interior planar surface of the core so that the upper planar surface of the electronic component is level with the upper planar surface of the core; and an upper metallization structure configured to provide one or more conductive paths from the one or more electronic component terminals to one or more upper metal terminals of the upper metallization structure.

28 Claims, 10 Drawing Sheets

(56) References Cited

U.S. PATENT DOCUMENTS

| | | | |
|---|---|---|---|
| 2017/0359898 A1* | 12/2017 | Shan ......................... | H05K 3/30 |
| 2020/0005999 A1* | 1/2020 | Masuda ................... | H05K 1/18 |
| 2020/0196446 A1* | 6/2020 | Ko ......................... | H05K 1/115 |
| 2021/0159187 A1 | 5/2021 | Hsieh et al. | |
| 2023/0085411 A1 | 3/2023 | Paital et al. | |

* cited by examiner

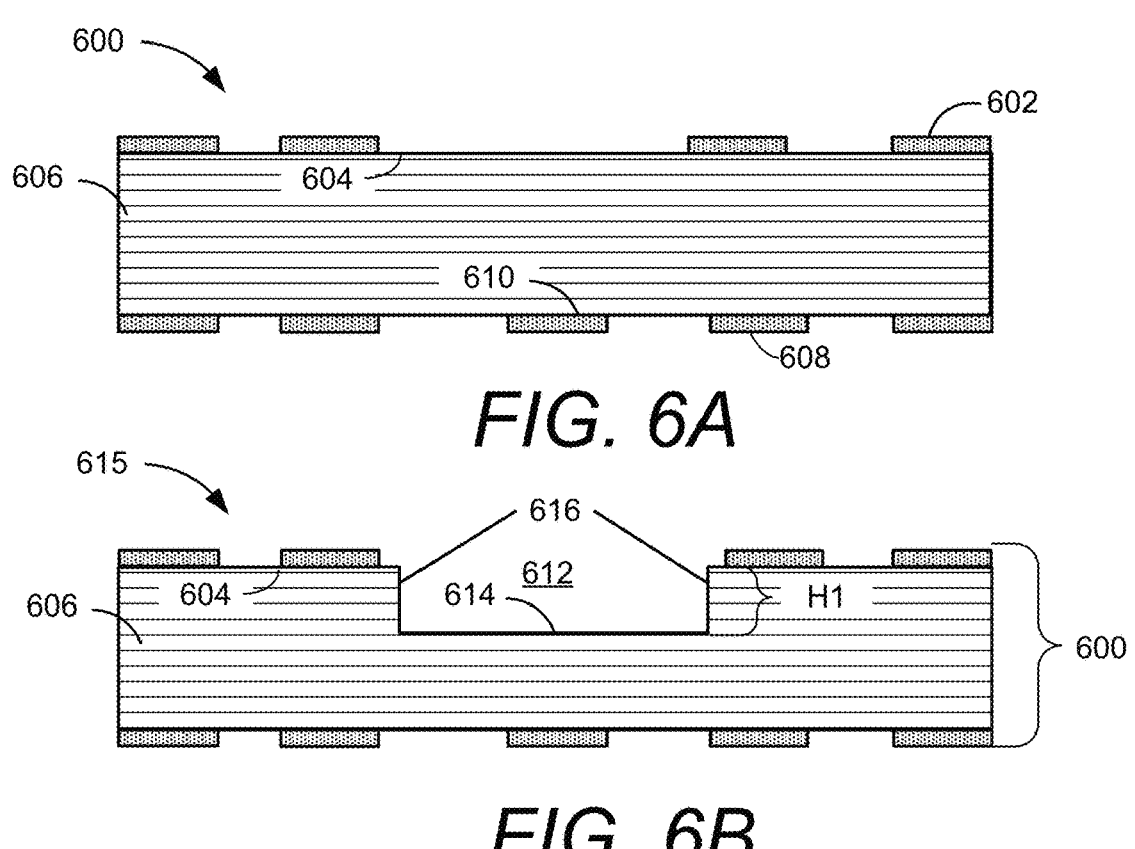
FIG. 6A
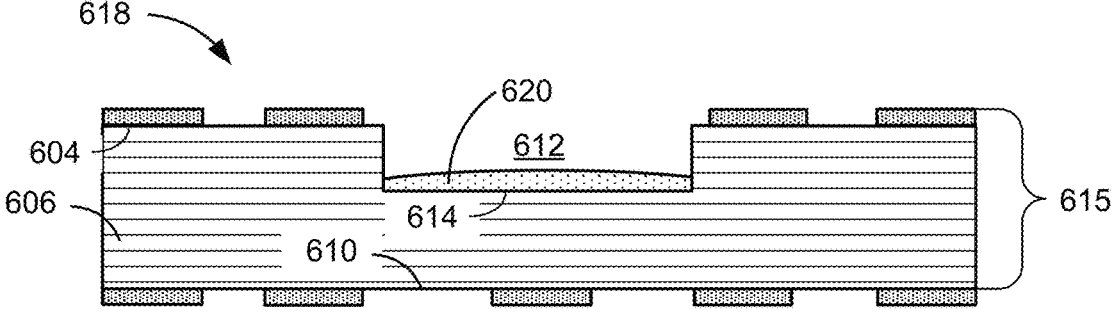
FIG. 6B
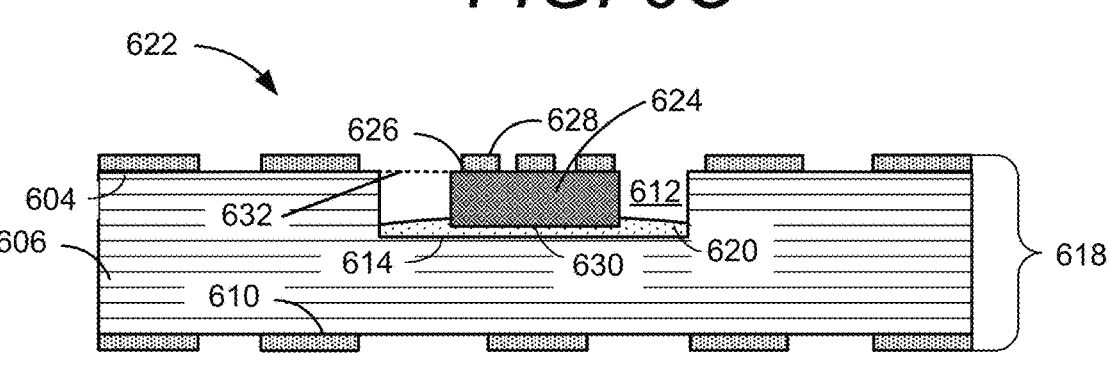
FIG. 6C
FIG. 6D

700 —

| | |
|---|---|
| Form a cavity extending from an upper planar surface of a core to an interior planar surface of the core | 702 |

| | |
|---|---|
| Insert an electronic component in the cavity so that an upper planar surface of the electronic component having one or more electronic component terminals is supported by the third planar surface of the core, wherein the electronic component is supported by the third planar surface of the core so that the upper planar surface of the electronic component is level with the upper planar surface of the core | 704 |

| | |
|---|---|
| Form an upper metallization structure over the upper planar surface of the core, wherein the upper metallization structure is configured to provide one or more conductive paths from the one or more electronic component terminals to one or more upper metal terminals of the upper metallization structure | 706 |

PROVIDE SUBSTRATE COMPRISING AT LEAST A PLURALITY OF INTERCONNECTS   — 905

COUPLE INTEGRATED DEVICE(S) AND/OR INTEGRATED PASSIVE DEVICE(S) TO A FIRST SURFACE OF
THE SUBSTRATE, WHERE AN INTEGRATED DEVICE AND/OR AN INTEGRATED PASSIVE DEVICE INCLUDES AN ELECTRONIC COMPONENT IN A CORE   — 910

COUPLE SOLDER INTERCONNECTS TO THE SUBSTRATE   — 915

PACKAGE SUBSTRATE HAVING EMBEDDED ELECTRONIC COMPONENT IN A CORE OF THE PACKAGE SUBSTRATE

FIELD OF DISCLOSURE

The present disclosure generally relates to a substrate, and more particularly, to a package substrate having an embedded electronic component mounted in a core of the package substrate, and methods of making the package substrate.

BACKGROUND

Integrated circuit (IC) technology has achieved great strides in advancing computing power through miniaturization of electrical components. An IC may be implemented in the form of an IC chip that has a set of circuits integrated thereon. In some implementations, one or more IC chips can be physically carried and protected by an IC package, where various power and signal nodes of the one or more IC chips can be electrically coupled to respective conductive terminals of the IC package via electrical paths formed in a package substrate of the IC package. Various packaging technologies can be found in many electronic devices, including processors, servers, radio frequency (RF) integrated circuits, etc. Advanced packaging and processing techniques can be used to implement complex devices, such as multi-electronic component devices and system on a chip (SOC) devices, which may include multiple function blocks, with each function block designed to perform a specific function, such as, for example, a microprocessor function, a graphics processing unit (GPU) function, a communications function (e.g., Wi-Fi, Bluetooth, and other communications), and the like.

In some implementations, embedded electronic components, such as deep trench capacitors, have been incorporated in IC packaging for performance improvement and package size reduction. One factor driving the use of such embedded electronic components is the desire for obtaining small form factor products with equivalent or better electrical performance than their larger electronic components counterparts. Depending on the size and/or thickness of the package substrate and the size and/or the process node of the IC Chip carried thereon, the process for embedding an electronic component in a package substrate in one packaging task may not be suitable for another packaging task.

Accordingly, there is a need for improved methods for embedding an electronic component in a substrate, such as a package substrate, that may be suitable for a broader variety of packaging tasks.

SUMMARY

The following presents a simplified summary relating to one or more aspects disclosed herein. Thus, the following summary should not be considered an extensive overview relating to all contemplated aspects, nor should the following summary be considered to identify key or critical elements relating to all contemplated aspects or to delineate the scope associated with any particular aspect. Accordingly, the following summary has the sole purpose to present certain concepts relating to one or more aspects relating to the mechanisms disclosed herein in a simplified form to precede the detailed description presented below.

In an aspect, a substrate includes a core having an upper planar surface and an interior planar surface; a cavity extending at least partially through the upper planar surface of the core to the interior planar surface of the core; an electronic component mounted in the cavity, the electronic component including an upper planar surface having one or more electronic component terminals, wherein the electronic component is supported by the interior planar surface of the core so that the upper planar surface of the electronic component is level with the upper planar surface of the core; and an upper metallization structure configured to provide one or more conductive paths from the one or more electronic component terminals to one or more upper metal terminals of the upper metallization structure.

In an aspect, an electronic device includes a substrate including a core having an upper planar surface and an interior planar surface; a cavity extending at least partially through the upper planar surface of the core to the interior planar surface of the core; an electronic component in the cavity, the electronic component including an upper planar surface having one or more electronic component terminals, wherein the electronic component is supported by the interior planar surface of the core so that the upper planar surface of the electronic component is level with the upper planar surface of the core; and an upper metallization structure configured to provide one or more conductive paths from the one or more electronic component terminals to one or more upper metal terminals of the upper metallization structure.

In an aspect, a method of forming a substrate includes forming a cavity extending from an upper planar surface of a core to an interior planar surface of the core; inserting an electronic component in the cavity so that an upper planar surface of the electronic component having one or more electronic component terminals is supported by the interior planar surface of the core, wherein the electronic component is supported by the interior planar surface of the core so that the upper planar surface of the electronic component is level with the upper planar surface of the core; and forming an upper metallization structure over the upper planar surface of the core, wherein the upper metallization structure is configured to provide one or more conductive paths from the one or more electronic component terminals to one or more upper metal terminals of the upper metallization structure.

Other objects and advantages associated with the aspects disclosed herein will be apparent to those skilled in the art based on the accompanying drawings and detailed description.

BRIEF DESCRIPTION OF THE DRAWINGS

A more complete appreciation of aspects of the disclosure and many of the attendant advantages thereof will be readily obtained as the same becomes better understood by reference to the following detailed description when considered in connection with the accompanying drawings which are presented solely for illustration and not limitation of the disclosure.

FIGS. 6A through 6G illustrate example steps undertaken in fabricating a substrate, according to aspects of the disclosure.

FIG. 7 is a flowchart showing an example method for fabricating a substrate, according to aspects of the disclosure.

Figure 1:
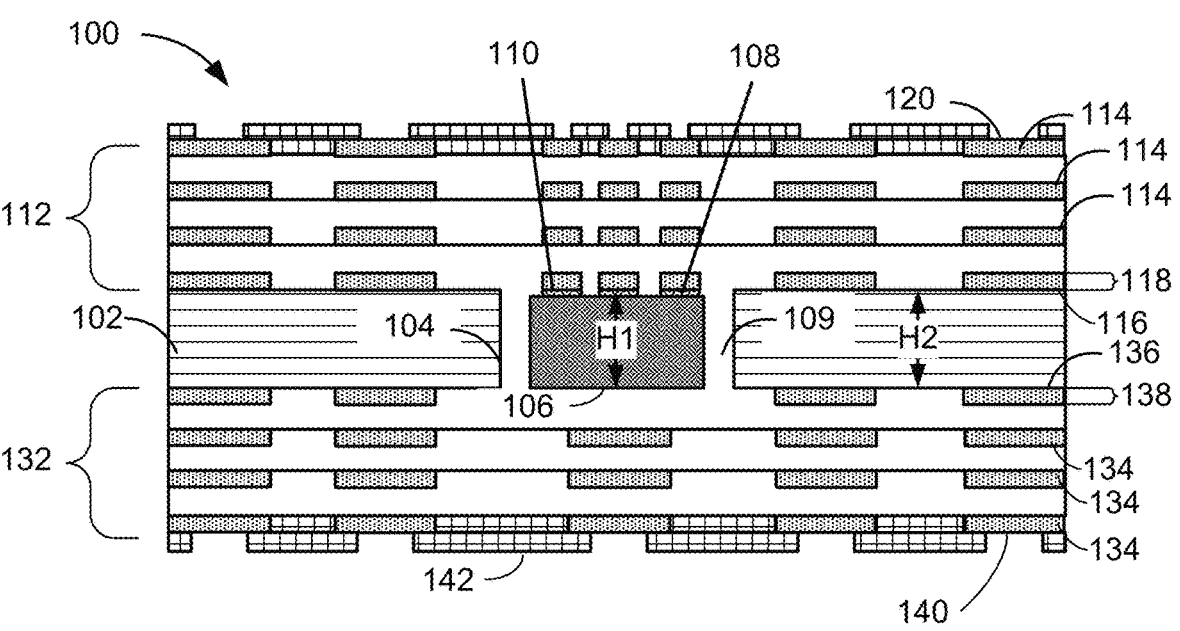
FIG. 1 is a cross-sectional view of a first example substrate with an embedded electronic component, according to aspects of the disclosure.

In accordance with common practice, the features depicted by the drawings may not be drawn to scale. Accordingly, the dimensions of the depicted features may be arbitrarily expanded or reduced for clarity. In accordance with common practice, some of the drawings are simplified for clarity. Thus, the drawings may not depict all components of a particular apparatus or method. Further, like reference numerals denote like features throughout the specification and figures.

DETAILED DESCRIPTION

Aspects of the present disclosure are illustrated in the following description and related drawings directed to specific embodiments. Alternate aspects or embodiments may be devised without departing from the scope of the teachings herein. Additionally, well-known elements of the illustrative embodiments herein may not be described in detail or may be omitted so as not to obscure the relevant details of the teachings in the present disclosure.

In certain described example implementations, instances are identified where various component structures and portions of operations can be taken from known, conventional techniques and then arranged in accordance with one or more exemplary embodiments. In such instances, internal details of the known, conventional component structures and/or portions of operations may be omitted to help avoid potential obfuscation of the concepts illustrated in the illustrative embodiments disclosed herein.

The terminology used herein is for the purpose of describing particular embodiments only and is not intended to be limiting. As used herein, the singular forms "a," "an," and "the" are intended to include the plural forms as well, unless the context clearly indicates otherwise. It will be further understood that the terms "comprises," "comprising." "includes," and/or "including." when used herein, specify the presence of stated features, integers, steps, operations, elements, and/or components, but do not preclude the presence or addition of one or more other features, integers, steps, operations, elements, components, and/or groups thereof.

FIG. 1 is a cross-sectional view of a first example substrate 100 with an embedded electronic component, according to aspects of the disclosure. In this example, the substrate 100 includes a core 102 having a cavity 104 that extends entirely through the core 102. An electronic component 106 is disposed within the cavity 104. The electronic component 106 has an upper surface 108 with metal terminals 110 that provide an electrical connection to the electronic component 106. In accordance with various aspects of the disclosure, the electronic component 106 may be one or more of an active electronic component, a passive electronic component (e.g., a deep trench capacitor (DTC)), a die, etc.

In accordance with various aspects of the disclosure, the substrates described herein (e.g., substrate 100) that include a core and an embedded electronic component are directed to package substrates. A package substrate is the part of an integrated circuit package that gives the board its mechanical strength and allows it to connect with external devices. Such package substrates are to be distinguished from other substrates, such as the substrates that may be included in the embedded electronic component itself, dies including substrates (e.g., silicon substrates or other similar electronic devices).

The substrate 100 further includes a plurality of dielectric layers 112 and corresponding patterned metallization layers 114 overlying an upper surface 116 of the core 102. A patterned metallization layer 118 is disposed at the upper surface 116 of the core 102 to provide an electrical connection between the metal terminals 110 of the electronic component 106 and the patterned metallization layers 114. In an aspect, the same dielectric resin material as used in forming the plurality of dielectric layers 112 may be used in the regions 109 of the cavity 104 between the sidewalls of the electronic component 106 and the sidewalls of the cavity 104. Dispensing a dielectric resin over the electronic component 106 and in the regions 109 assists in securing the electronic component 106 within the cavity 104 so that the metal terminals 110 remain electrically connected with corresponding portions of the patterned metallization layer 118 once the dielectric resin is cured.

In an aspect, an uppermost patterned metallization layer 114 at an upper surface 120 of the substrate 100 is connected to a plurality of metal terminals 122. The patterned metallization layers 114 provide a conductive path between the metal terminals 110 of the electronic component 106 and the metal terminals 122. In an aspect, the plurality of metal terminals 122 may be configured for connection to an electronic package of a surface-mounted device (not shown in FIG. 1).

In an aspect, a further plurality of dielectric layers 132 and corresponding patterned metallization layers 134 overlie a lower surface 136 of the core 102. Here, a patterned metallization layer 138 is disposed over the lower surface 136 of the core 102. A lowermost patterned metallization layer 134 at a lower surface 140 of the substrate 100 is connected to a plurality of metal terminals 142. The patterned metallization layers 134 provide a conductive path to the metal terminals 142. In an aspect, the plurality of metal terminals 142 may be configured for connection to an electronic package of a further surface-mounted device (not shown in FIG. 1) or to a circuit board for connection with other devices.

In FIG. 1, the electronic component 106 has a height H1 that is substantially the same as the thickness H2 of the core 102. During manufacture of the substrate 100, the electronic component 106 is inserted in the cavity 104 before a dielectric resin is injected to fill the regions 109 between the cavity 104 and electronic component 106. During insertion, the electronic component 106 is carefully aligned within the cavity 104 to ensure that the metal terminals 110 properly contact and electrically bond with the corresponding portions of the patterned metallization layer 118. Additionally, the injection of the dielectric resin in the regions 109 should be undertaken with care so as not to disturb the initial alignment of the electronic component 106. In an aspect, the dielectric resin, once cured, secures the electronic component 106 at its proper location within the cavity 104.

In scenarios in which the height H1 of the electronic component 106 and thickness H2 of the core 102 are substantially the same, the insertion of the electronic component 106 in the cavity 104 and subsequent injection and cure of the dielectric resin may be implemented using the processing technology as described with reference to FIG. 1. In an example, the height H1 of the electronic component and the thickness H2 of the core 102 in FIG. 1 may each be equal to or less than about 760 micrometers.

Although the structure of the substrate 100 shown in FIG. 1 has been suitable for use in many high-performance applications (e.g., compute and automotive applications), current trends are directed to applications requiring substrates having larger body sizes. However, substrates having large bodies present unique design and manufacturing issues that must be addressed (e.g., substrate warpage, a need for larger cavity sizes, a need for larger keep-out zones, etc.). These issues may be addressed, at least in part, by employing thick cores in the design and manufacture of such substrates. For example, warpage control is more easily achieved with thick cores than with thin cores. Additionally, the need for larger cavity sizes and keep-out zones can be met by employing such thick cores.

However, substrates employing thick cores may be difficult to manufacture using the same packaging technologies that are used in manufacturing substrates having thin cores of the type described in connection with FIG. 1. With thick cores, there is a significant gap between the electronic component and the cavity resulting from the increased depth of the cavity compared to the height of the electronic component (e.g., the thick core has a thickness that is greater than the height of the electronic component). In such thick core scenarios, it may be difficult or impossible to fill the gap surrounding the electronic component with the dielectric resin in a manner that maintains the proper initial alignment of the electronic component in the cavity during the resin injection. Further, it may be difficult or impossible to inject a sufficient amount of dielectric resin in the gap to secure the electronic component at its desired position once the dielectric resin is cured.

Figure 2:
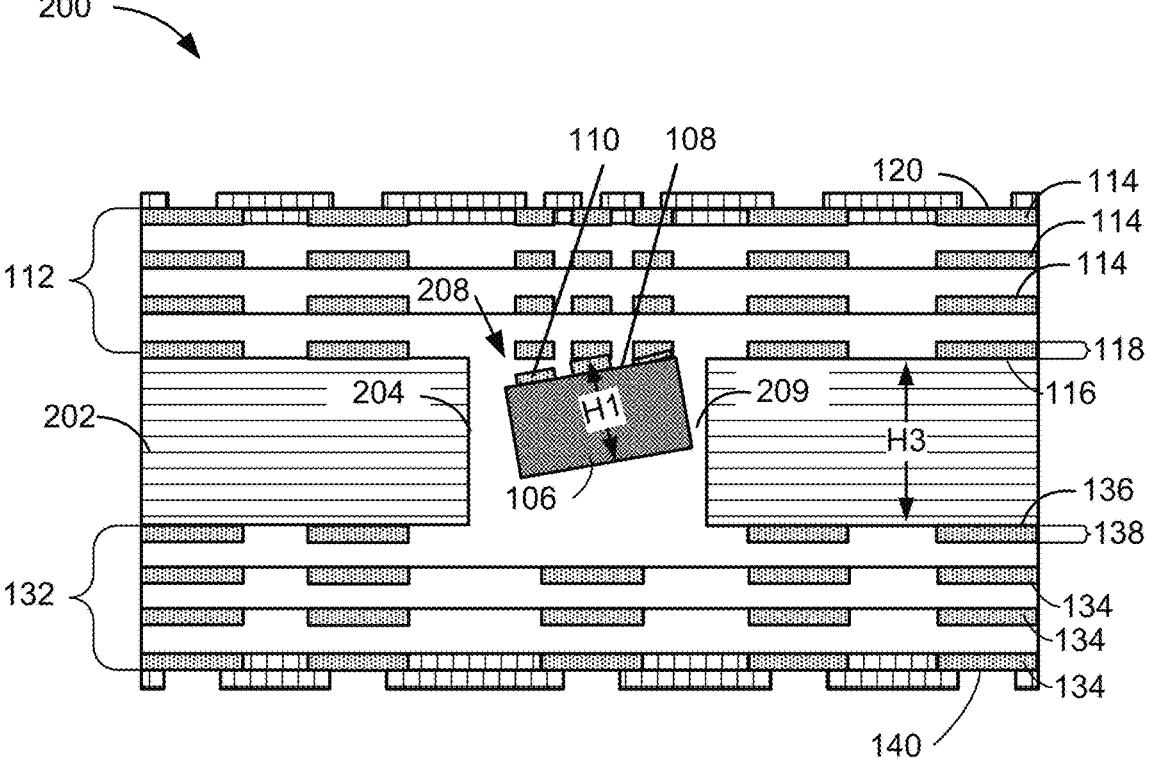
FIG. 2 is a cross-sectional view of a second example substrate with an embedded electronic component, according to aspects of the disclosure.

FIG. 2 is a cross-sectional view of an example substrate 200 with an embedded electronic component, according to aspects of the disclosure. In this example, it is assumed that the substrate 200 has been manufactured using the same processing operations as used to manufacture the substrate 100 shown in FIG. 1. For purposes of simplicity, certain reference numbers used in FIG. 1 have also been used to designate similar elements in FIG. 2.

In the example shown in FIG. 2, the substrate 200 differs from the substrate 100 of FIG. 1 in that the substrate 200 employs a thick core 202 having a thickness H3 that is greater than the height H1 of the electronic component 106. In accordance with certain aspects of the disclosure, the thickness H3 is greater than about 760 micrometers and, as such, is thicker than the electronic component 106 and its thin core 102 counterpart. In certain scenarios, the thick core may have a thickness that is substantially greater than 760 micrometers (e.g., 820 micrometers, 1240 micrometers, etc.).

The substrate 200 has a cavity 204 that is substantially deeper than the cavity 104 of the substrate 100. As such, it becomes more difficult to align the metal terminals 110 with the corresponding portions of the patterned metallization layer 118 during the initial placement of the electronic component 106 within the cavity 204. Initial misalignment of the electronic component 106 may fail to establish an electrical connection between the metal terminals 110 and corresponding portions of the patterned metallization layer 118. Additionally, it becomes challenging to correctly fill the cavity 209 (e.g., particularly including the extended regions of the cavity 209) with an amount of dielectric resin that, once cured, properly surrounds and secures the electronic component 106 in place within the cavity 204. An insufficient fill of the cavity 204 with the dielectric resin can lead to subsequent delamination of the electronic component 106 from electrical contact with the corresponding portions of the patterned metallization layer 118 once the substrate 200 is incorporated in a more extensive electronic system (e.g., automobile sensors/computers, mobile devices, or any other type of electronic device as described herein). In FIG. 2, an instance of delamination is shown at region 208, where some of the metal terminals 110 have pulled away from the corresponding portions of the patterned metallization layer 118.

Certain aspects of the disclosure are implemented with a recognition of the problems associated with using existing processing technologies to manufacture substrates having certain types of cores (e.g., thick cores) and/or certain types of electronic component (e.g., deep trench capacitors). In accordance with certain aspects of the disclosure, the electronic component may be embedded in the substrate within a cavity formed in an upper planar surface of a core to an interior planar surface of the core. In an aspect, the electronic component is supported by the interior planar surface of the core so that an upper planar surface of the electronic component on which the electronic component contacts are located is level with the upper planar surface of the core. This architecture allows the same upper face routing of the electronic component contacts (e.g., as shown in FIG. 1) without the embedded electronic component support and delamination issues associated with a cavity extending completely through the core (e.g., as shown in FIG. 2). In an aspect, the cavity may be filled with a fill material, such as a dielectric resin, to secure the electronic component within the cavity. The fill material may be deposited in the cavity without voids that may otherwise lead to failure of the substrate. In accordance with certain aspects of the disclosure, the thickness of the core is no longer a limiting factor that needs to be considered when embedding the electronic component in the substrate.

Figure 3:
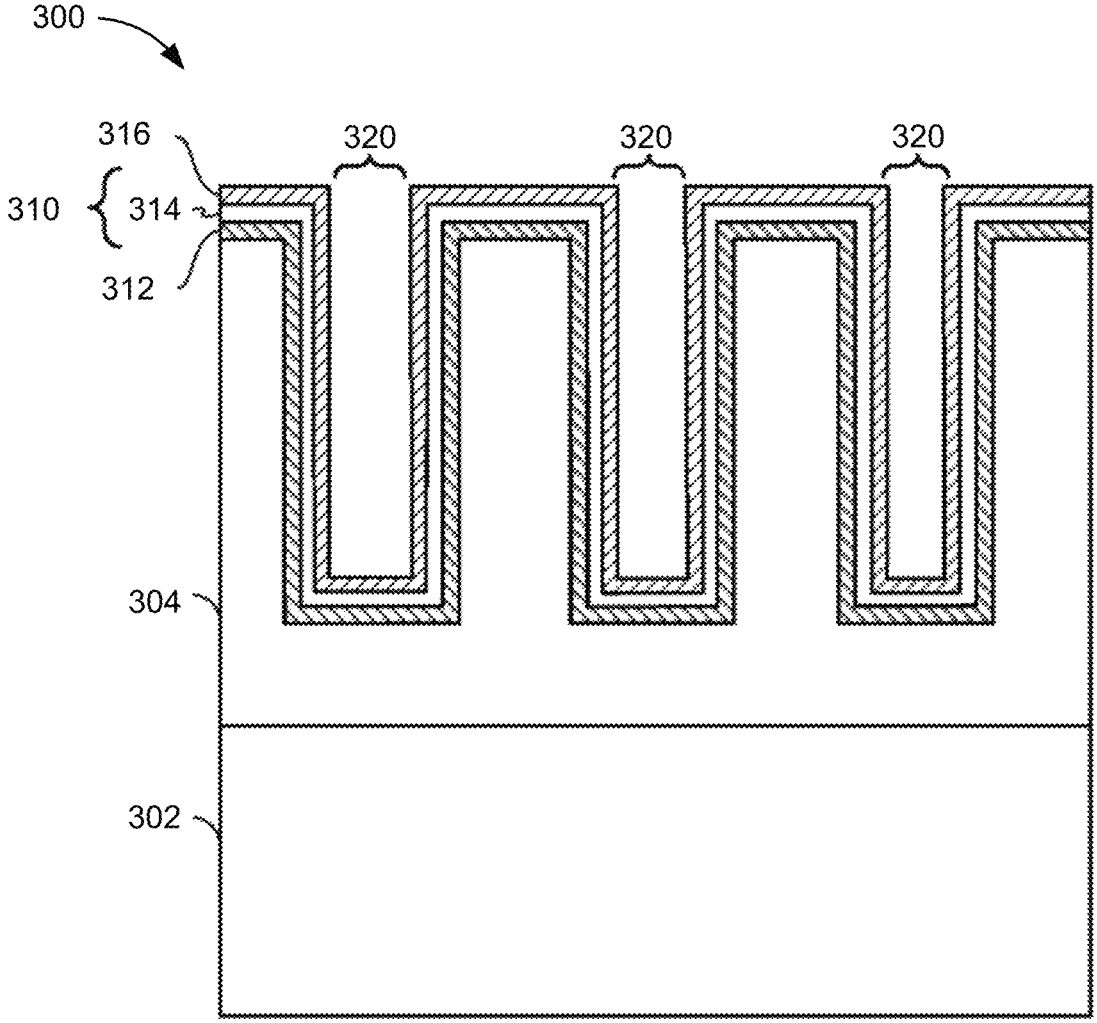
FIG. 3 is a cross-sectional view of an example deep trench capacitor, according to aspects of the disclosure.

According to certain aspects of the disclosure, the electronic component may be a DTC. FIG. 3 is a cross-sectional view of an example DTC 300, according to aspects of the disclosure. In FIG. 3, a capacitor 310 is deposited in trenches 320 of an insulator 304 on a substrate 302. The capacitor 310 may include a metal layer 312, a dielectric layer 314, and a metal layer 316. The dielectric layer 314 separates the metal layer 312 from the metal layer 316. The metal layers 312, 316 form electrodes of the capacitor 310 and may be connected to terminals at, for example, a surface (see, e.g., the upper surface 108 with metal terminals 110 of electronic component 106 shown in FIG. 1). In some scenarios, the capacitors are formed from an array of deep trenches in a substrate and filled with an electrical insulator (e.g., a dielectric) between layers of electrodes. In some scenarios, the capacitors are attached on the land side under in integrated circuit die shadow (land-side capacitor: LSC) or adjacent to the die on the die side (die-side capacitor: DSC).

Figure 4:
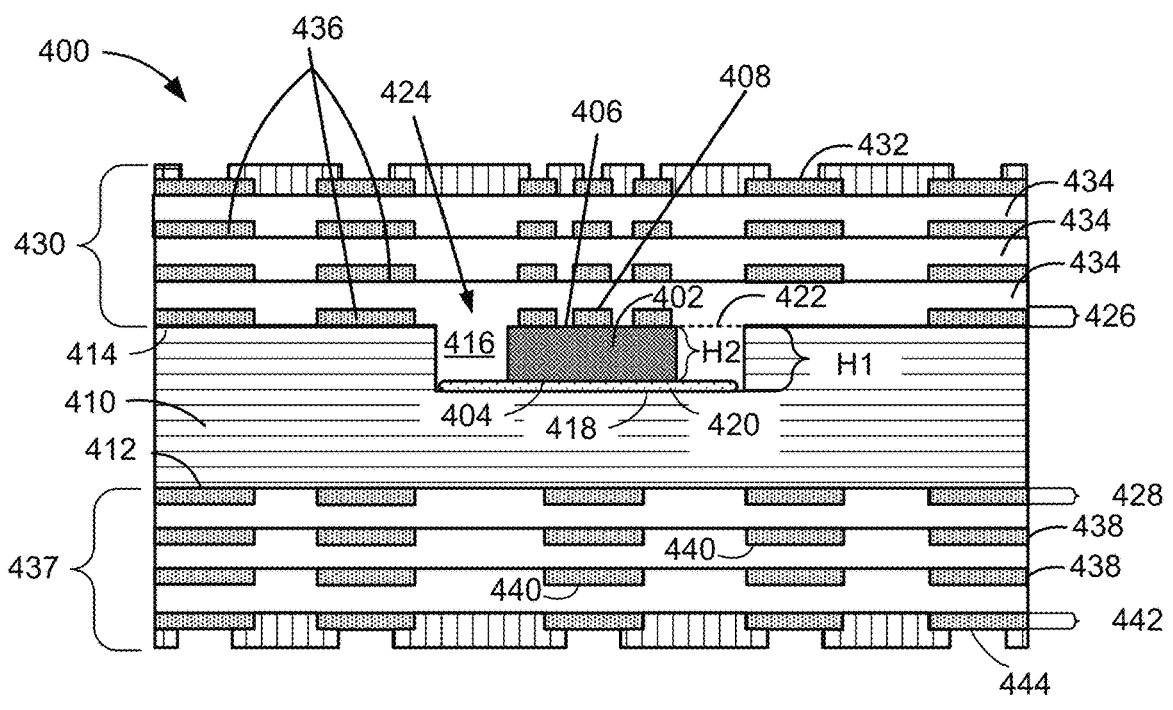
FIG. 4 is a cross-sectional view of an example substrate, according to aspects of the disclosure.

FIG. 4 is a cross-sectional of view of an example substrate 400, according to aspects of the disclosure. In this example, the substrate 400 includes an electronic component 402 having a lower planar surface 404 and an upper planar surface 406. The upper planar surface 406 of the electronic component 402 includes one or more electronic component terminals 408 providing an electrical connection with the electronic component 402.

The substrate 400 further includes a core 410 having a lower planar surface 412 (e.g., a first planar surface), an upper planar surface 414 (e.g., a second planar surface), and an interior planar surface 418. A cavity 416 is formed in the upper planar surface 414 of the core 410 and extends through at least a portion of the core 410 to the interior planar surface 418 of the core 410. The interior planar surface 418 of the core 410 may be an interior portion of the core 410. The lower planar surface 404 of the electronic component 402 faces the interior planar surface 418, which either directly supports the electronic component 402 or indirectly supports the electronic component 402 through an intermediate layer 420 (e.g., an adhesive layer). The depth of H1 the cavity 416 is substantially the same dimension as the height H2 of the electronic component 402 as measured between the upper planar surface 406 and lower planar surface 404 of the electronic component 402. As such, the upper planar surface 406 of the electronic component 402 is substantially level with the upper planar surface 414 of the core 410, as shown at dashed line 422. In an aspect, the cavity 416 is dimensioned so that it may be filled with a filler material 424, such as a dielectric resin, without voids. This configuration allows the electronic component 402 to be connected using the same upper face connection configuration as shown in FIG. 1 while also being mounted at a fixed position within the cavity 416 so as to limit the chances of delamination of the electronic component 402 from connection with the other layers of the substrate 400. If the intermediate layer 420 (e.g., adhesive layer) is used, the thickness of the intermediate layer 420 should be such that the upper planar surface of the electronic component 402 still remains level with the upper planar surface of the core 410.

In an aspect, the core 410 may include a patterned metallization layer 426 on the upper planar surface 414. In the example shown in FIG. 4, the patterned metallization layer 426 may be connected to the one or more electronic component terminals 408. A patterned metallization layer 428 may also be disposed over the lower planar surface 412 of the core 410.

According to certain aspects of the disclosure, the substrate 400 may include an upper metallization structure 430 configured to provide one or more conductive paths from the one or more electronic component terminals 408 to one or more upper metal terminals 432 of the upper metallization structure 430. In the example shown in FIG. 4, the upper metallization structure 430 includes one or more dielectric layers 434 disposed over the upper planar surface 414 of the core 410. Although the dielectric layers 434 are shown in FIG. 4 as separate layers, it will be understood that multiple dielectric layers may be fused during the manufacturing process so as to appear and function as a single dielectric structure. Further, it will be understood that different layers of the dielectric layers 434 may be formed from different dielectric materials during the manufacturing process. In an aspect, different dielectric materials for the different dielectric layers may be used when one or more of the dielectric layers 434 are to have a different dielectric constant than another of the dielectric layers 434.

In accordance with certain aspects of the disclosure, each of the dielectric layers 434 is associated with a corresponding patterned metallization layer 436. One or more metal via structures may be formed through the dielectric layers 434.

The metal via structures provide an electrically conductive path between the one or more electronic component terminals 408 of the electronic component 402 and the metal terminals 432 formed by an upper metallization layer of the upper metallization structure 430. In accordance with certain aspects of the disclosure, the metal terminals 444 may be configured for connection to an electronic circuit package (not shown in FIG. 4) mounted at the upper surface of the substrate 400.

As noted, the cavity 416 may be filled with the filler material 424 to mount the electronic component 402 within the cavity 416. In an aspect, the filler material 424 may completely fill the cavity 416 so that the entirety of the electronic component 402 is enclosed by the filler material 424. In an aspect, the filler material 424 may be comprised of the same dielectric material used to form the dielectric layers 434. Again, it will be understood that the filler material 424 in the cavity 416 may be fused with the dielectric layers 434 so as to appear and function as a single dielectric structure that surrounds the electronic component 402. Further, it will be understood that the filler material 424 may comprise a material other than the dielectric material used to form the dielectric layers 434.

In an aspect, substrate 400 may include a lower metallization structure 437 having a further set of one or more dielectric layers 438 and a corresponding set of patterned metallization layers 440 disposed over the lower planar surface 412 of the core 410. As shown, the dielectric layers 438 may separate the patterned metallization layers 440 from one another. One or more metal via structures may extend between the patterned metallization layers 440 and connect with metal terminals 444 at a lowermost patterned metallization layer 442 at a lower surface of the substrate 400. In accordance with various aspects of the disclosure, the metal terminals 444 may be configured for mounting the substrate 400 to another substrate and/or to an electrical device package (not shown in FIG. 4).

Figure 5:
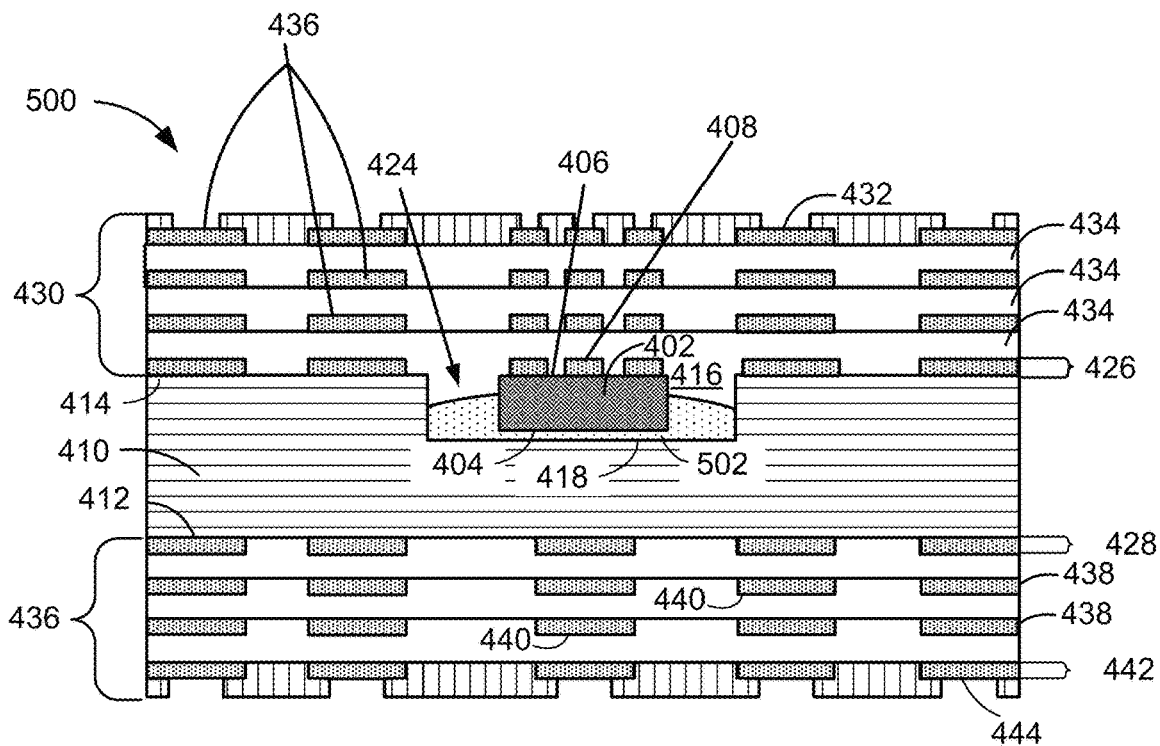
FIG. 5 is a cross-sectional view of an example substrate, according to aspects of the disclosure.

FIG. 5 is a cross-sectional view of an example substrate 500, according to aspects of the disclosure. In this example, the substrate 500 is similar in most respects to substrate 400 shown in FIG. 4. Accordingly, like reference numbers have been used to reference similar elements. Unlike the substrate 400, the substrate 500 includes a non-conductive paste 502 disposed between the lower planar surface 404 of the electronic component 402 and the interior planar surface 418 of the cavity 416 to facilitate securement of the electronic component 402 in the cavity 416. In an aspect, the non-conductive paste 502 at least partially surrounds one or more sidewalls of the electronic component 402. In addition to facilitating securement of the electronic component 402 in place in a completed substrate 500, the non-conductive paste 502 may also serve to hold the electronic component 402 in position during fabrication (e.g., filling of the cavity 416).

Figures 6E, 6F:
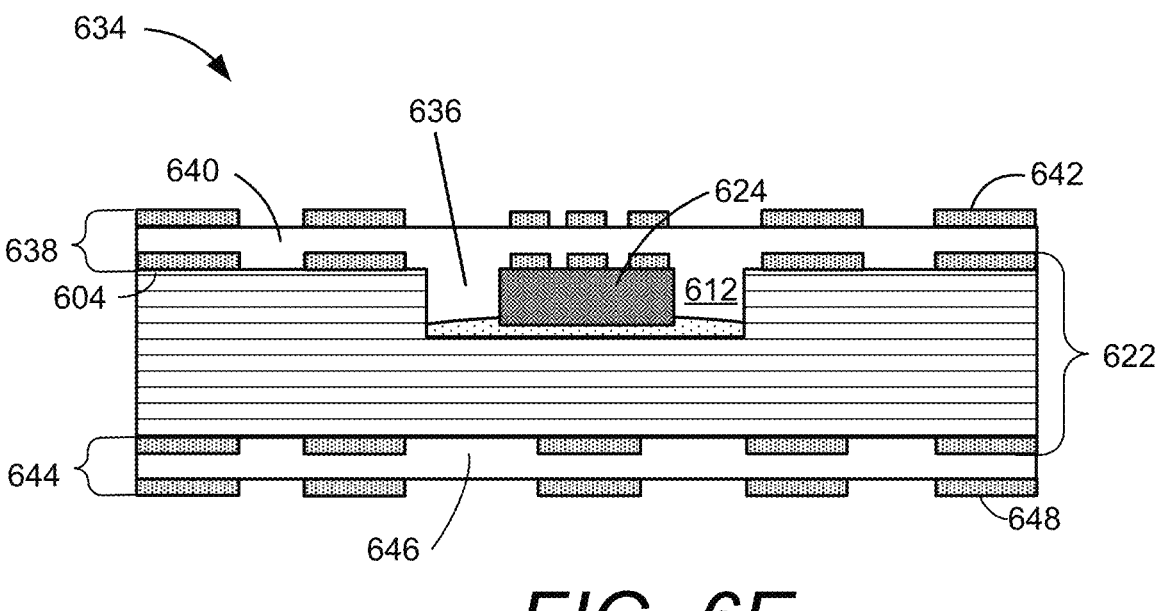

FIGS. 6A through 6H illustrate example steps undertaken in fabricating a substrate, according to aspects of the disclosure. As shown in FIG. 6A, a first intermediate structure 600 is formed with a patterned metallization layer 602 that is disposed over an upper planar surface 604 of a core 606. Additionally, a further patterned metallization layer 608 is formed over a lower surface 610 of the core 606.

As shown in FIG. 6B, a cavity 612 is formed in the upper planar surface 604 of the first intermediate structure 600 to form a second intermediate structure 615. The cavity 612 is bounded by sidewalls 616 of the core 606 and an interior planar surface 614 of the core 606. In an aspect, depth H1 of the cavity 612 corresponds to the height of the electronic component that is to be mounted in the cavity 612.

As shown in FIG. 6C, a third intermediate structure 618 is formed when an adhesive layer 620 (and/or a layer of non-conductive paste) is placed over the interior planar surface 614 of the core 606. In an aspect, the amount of adhesive (or non-conductive paste) dispensed for the adhesive layer 620 depends on the extent to which the adhesive layer is to engage the electronic component that is mounted in the cavity 612. A larger amount of adhesive may be used when the electronic component is to be at least partially embedded in the adhesive layer (e.g., the adhesive layer extends to the regions between sidewalls 616 of the core 606 and the peripherals sidewalls of the electronic component).

As shown in FIG. 6D, a fourth intermediate structure 622 is formed when an electronic component 624 is inserted into the cavity 612 with its upper planar surface 626 having the electronic component terminals 628 facing upward and its lower planar surface 630 facing the interior planar surface 614 of the core 606. In this example, the lower planar surface 630 of the electronic component 624 is adhered to the interior planar surface 614 by the adhesive layer 620. As noted herein, the depth of the cavity 612 is substantially the same dimension as the height of the electronic component 624 so that the upper planar surface 626 of the electronic component 624 is level with the upper planar surface 604 of the core 606 (e.g., as shown at dotted line 632) when the electronic component 624 is seated in the cavity 612. It will be understood, based on the teachings of the disclosure, that the depth of the cavity 612 may take into account the amount by which the electronic component 624 is elevated by the adhesive layer 620. As such, the depth of the cavity 612 may depend on the amount of material used to form the adhesive layer 620 or any other thin layer overlying the interior planar surface 614.

FIG. 6E shows a fifth intermediate structure 634 in which the cavity 612 has been filled with a filler material 636, which assists in securing the electronic component 624 within the cavity 612. In an aspect, the filler material 636 may be formed from a dielectric resin or other non-conductive viscous material. The fifth intermediate structure 634 is subject to a layer build-up process in which a further layer 638 including a dielectric layer 640 and patterned metallization layer 642 is formed over the upper surface of the fourth intermediate structure 622. In an aspect, the filler material 636 may be formed from the same dielectric material as dielectric layer 640 and deposited during the same layer build-up operation. Additionally, a layer 644 including dielectric layer 646 and a patterned metallization layer 648 are formed over the lower surface of the fourth intermediate structure 622 during a layer build-up process.

In FIG. 6F, a sixth intermediate structure 650 is formed by subjecting the fifth intermediate structure 634 to a further layer build-up process to form layers 652 and 654. It will be understood that metal via structures may be formed during the layer build-up processes to establish electrically conductive paths between the layers.

Figure 6G:
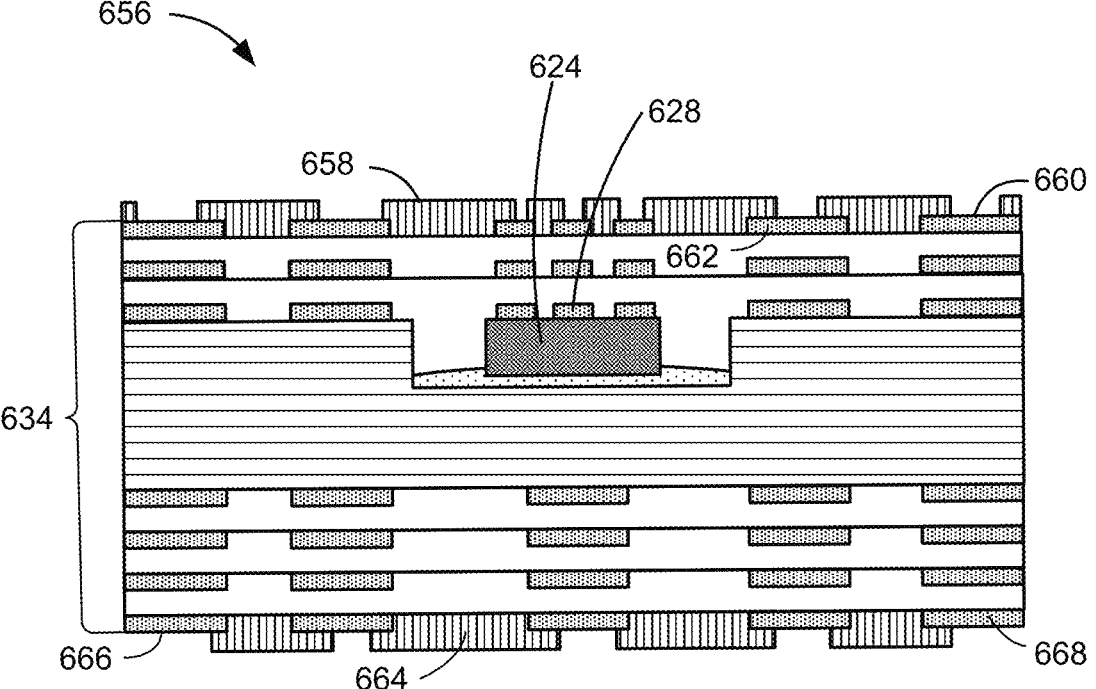

FIG. 6G shows a completed substrate 656, according to aspects of the disclosure. Here, a plurality of metal terminals 658 may be formed at the upper surface 660 of the substrate to provide an electrical connection with the patterned metallization layer 662. The patterned metallization layer 662 may be connected with the electronic component terminals 628 of the electronic component 624 through electrically conductive paths formed by metal vias deposited during the layer build-up processes. As noted herein, the metal terminals 658 may be configured for connection with an electronic package of a surface-mounted device.

As shown in FIG. 6G, an additional plurality of metal terminals 664 are formed at the lower surface 666 of the substrate and are electrically connected with the lowermost patterned metallization layer 668. As noted herein, the metal terminals 664 may be configured for connection with another electronic package of a surface-mounted device, connection with another substrate, or the like.

FIG. 7 is a flowchart showing an example method 700 for fabricating a substrate, according to aspects of the disclosure. At operation 702, a cavity is formed in a core that extends from an upper planar surface of the core to an interior planar surface of the core. At operation 704, an electronic component is inserted in the cavity so that an upper planar surface of the electronic component having one or more electronic component terminals is supported by the interior planar surface of the core, wherein the electronic component is supported by the interior planar surface of the core so that the upper planar surface of the electronic component is level with the upper planar surface of the core. At operation 706, an upper metallization structure is formed and configured to provide one or more conductive paths from the one or more electronic component terminals to one or more upper metal terminals of the upper metallization structure A technical advantage of the method 700 is that it may be used to form a substrate with an embedded electronic component (e.g., deep trench capacitor) and a core, where the fabrication processes are not dependent on the thickness of the core.

Figure 8:
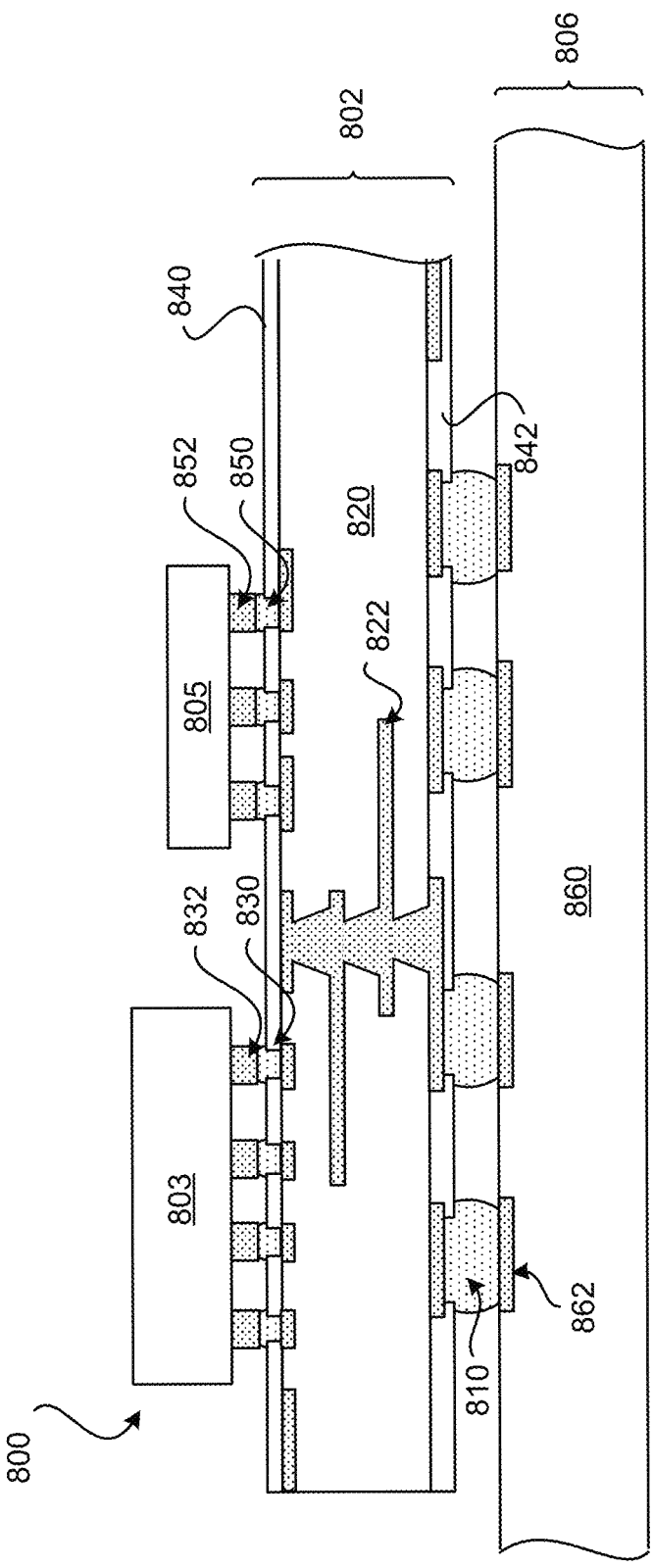
FIG. 8 illustrates a profile view of a package that includes a surface mount substrate, an integrated device and an integrated passive device, according to aspects of the disclosure.

FIG. 8 illustrates a profile view of a package 800 that includes a surface mount substrate 802, an integrated device 803, and an integrated passive device 805 (e.g., a substrate having an embedded electronic component and a core), according to aspects of the disclosure. The package 800 may be coupled to a printed circuit board (PCB) 806 through a plurality of solder interconnects 810. The PCB 806 may include at least one board dielectric layer 860 and a plurality of board interconnects 862.

The surface mount substrate 802 includes at least one dielectric layer 820 (e.g., substrate dielectric layer), a plurality of interconnects 822 (e.g., substrate interconnects), a solder resist layer 840 and a solder resist layer 842. The integrated device 803 may be coupled to the surface mount substrate 802 through a plurality of solder interconnects 830. The integrated device 803 may be coupled to the surface mount substrate 802 through a plurality of pillar interconnects 832 and the plurality of solder interconnects 830. The integrated passive device 805 may be coupled to the surface mount substrate 802 through a plurality of solder interconnects 850. The integrated passive device 805 may be coupled to the surface mount substrate 802 through a plurality of pillar interconnects 852 and the plurality of solder interconnects 850.

The package (e.g., 800) may be implemented in a radio frequency (RF) package. The RF package may be a radio frequency front end (RFFE) package. A package (e.g., 800) may be configured to provide Wireless Fidelity (WiFi) communication and/or cellular communication (e.g., 2G, 3G, 4G, 5G). The package (e.g., 800) may be configured to support Global System for Mobile (GSM) Communications, Universal Mobile Telecommunications System (UMTS), and/or Long-Term Evolution (LTE). The package (e.g., 800) may be configured to transmit and receive signals having different frequencies and/or communication protocols.

Figure 9:
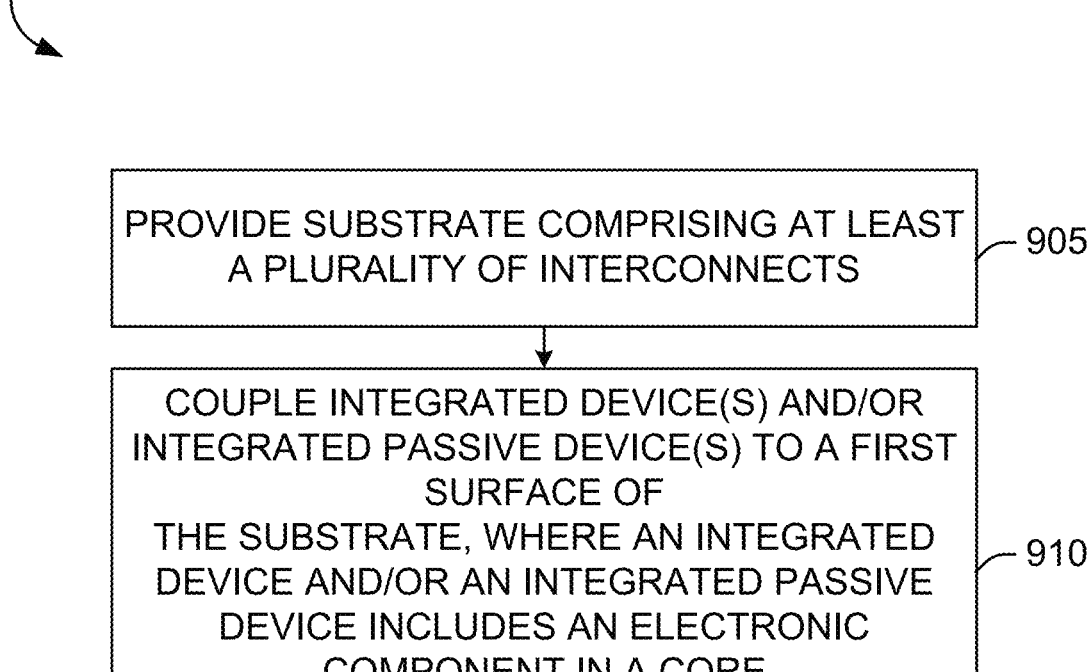
FIG. 9 illustrates an exemplary flow diagram of a method for fabricating a package that includes a substrate, an integrated device and an integrated passive device.

FIG. 9 illustrates an example method 900 for providing or fabricating a package that includes an integrated device comprising an electronic component mounted in a core, according to aspects of the disclosure. In some implementations, the method 900 of FIG. 9 may be used to provide or fabricate the package 800 of FIG. 8 described in the disclosure. However, the method 900 may be used to provide or fabricate any of the packages described in the disclosure.

It should be noted that the method of FIG. 9 may combine one or more processes in order to simplify and/or clarify the method for providing or fabricating a package that includes an integrated device comprising an electronic component mounted in a core, according to aspects of the disclosure. In some implementations, the order of the processes may be changed or modified.

The method provides (at 905) a substrate (e.g., 802). The substrate 802 may be provided by a supplier or fabricated. The substrate 802 includes at least one dielectric layer 820, and a plurality of interconnects 822. The substrate 802 may include an embedded trace substrate (ETS). In some implementations, the at least one dielectric layer 820 may include prepreg layers.

The method couples (at 910) at least one integrated device (e.g., 803) to the first surface of the substrate (e.g., 802). For example, the integrated device 803 may be coupled to the substrate 802 through the plurality of pillar interconnects 832 and the plurality of solder interconnects 830. The plurality of pillar interconnects 832 may be optional. The plurality of solder interconnects 830 are coupled to the plurality of interconnects 822. A solder reflow process may be used to couple the integrated device 803 to the plurality of interconnects through the plurality of solder interconnects 830.

The method also couples (at 910) at least one integrated passive device (e.g., 805) to the first surface of the substrate (e.g., 802). For example, the integrated passive device 805 may be coupled to the substrate 802 through the plurality of pillar interconnects 852 and the plurality of solder interconnects 850. The plurality of pillar interconnects 852 may be optional. The plurality of solder interconnects 850 are coupled to the plurality of interconnects 822. A solder reflow process may be used to couple the integrated passive device 805 to the plurality of interconnects through the plurality of solder interconnects 850.

The method couples (at 915) a plurality of solder interconnects (e.g., 810) to the second surface of the substrate (e.g., 802). A solder reflow process may be used to couple the plurality of solder interconnects 810 to the substrate.

Figure 10:
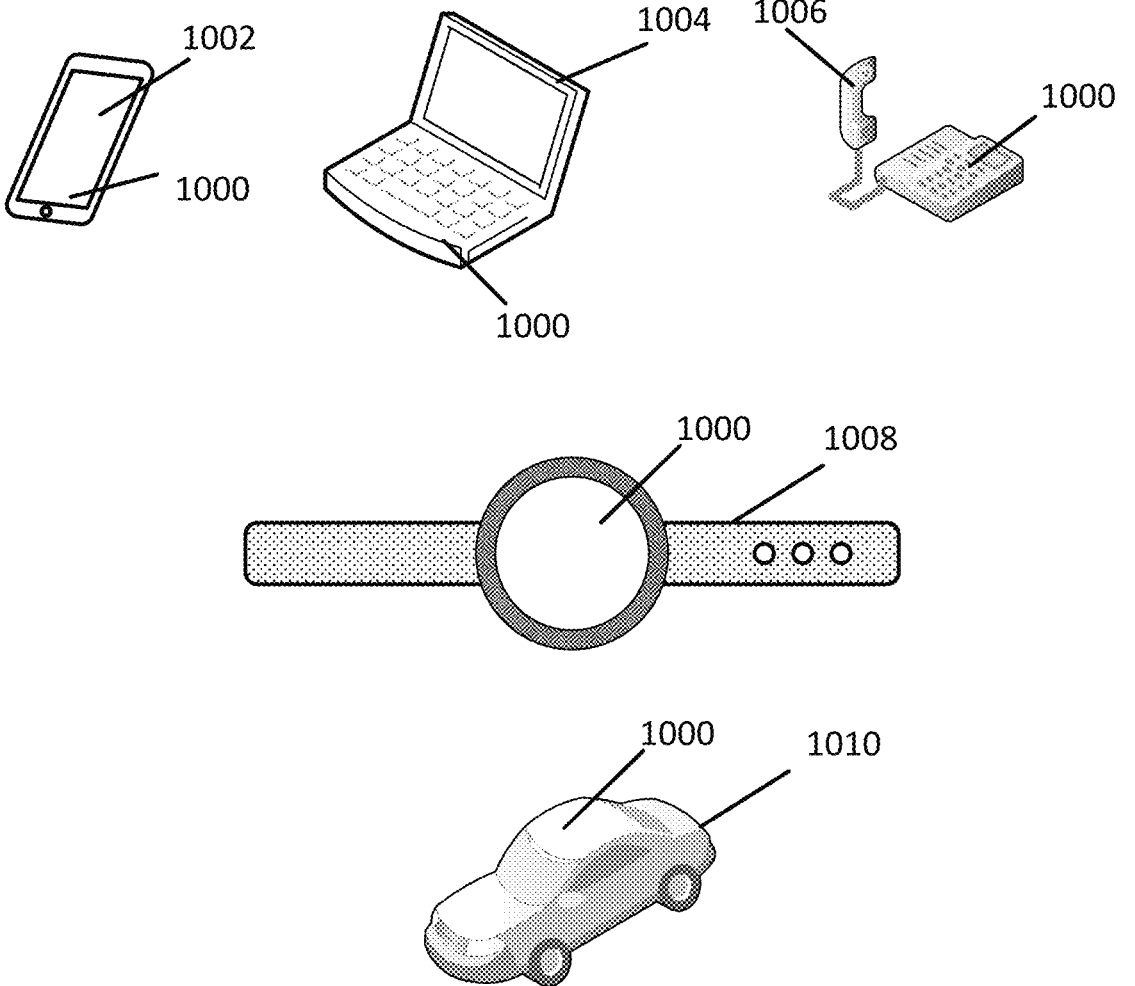
FIG. 10 illustrates various electronic devices that may integrate an electronic component, an electronic circuit, an integrated device, an integrated passive device, a passive component, a package, and/or a device package described herein.

FIG. 10 illustrates various electronic devices that may be integrated with any of the aforementioned devices, integrated devices, integrated circuit (IC) packages, integrated circuit (IC) devices, semiconductor devices, integrated circuits, electronic components, interposer packages, package-on-package (POP), System in Package (SiP), or System on Chip (SoC). For example, a mobile phone device 1002, a laptop computer device 1004, a fixed location terminal device 1006, a wearable device 1008, or automotive vehicle 1010 may include a device 1000 as described herein. The device 1000 may be, for example, any of the devices and/or integrated circuit (IC) packages described herein. The devices 1002, 1004, 1006 and 1008 and the vehicle 1010 illustrated in FIG. 10 are merely exemplary. Other electronic devices may also feature the device 1000 including, but not limited to, a group of devices (e.g., electronic devices) that includes mobile devices, hand-held personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices (e.g., watches, glasses), Internet of things (IoT) devices, servers, routers, electronic devices implemented in automotive vehicles (e.g., autonomous vehicles), or any other device that stores or retrieves data or computer instructions, or any combination thereof.

Implementation examples are described in the following numbered aspects:

Aspect 1. A substrate, comprising: a core having an upper planar surface and an interior planar surface; a cavity extending at least partially through the upper planar surface of the core to the interior planar surface of the core; an electronic component mounted in the cavity, the electronic component including an upper planar surface having one or more electronic component terminals, wherein the electronic component is supported by the interior planar surface of the core so that the upper planar surface of the electronic component is level with the upper planar surface of the core; and an upper metallization structure configured to provide one or more conductive paths from the one or more electronic component terminals to one or more upper metal terminals of the upper metallization structure.

Aspect 2. The substrate of aspect 1, wherein: the cavity has a stepped cross-section.

Aspect 3. The substrate of any of aspects 1 to 2, further comprising: an adhesive layer disposed between the interior planar surface of the core and the lower planar surface of the electronic component, wherein the adhesive layer has a thickness so that the upper planar surface of the electronic component is level with the upper planar surface of the core.

Aspect 4. The substrate of any of aspects 1 to 3, wherein: the electronic component is at least partially surrounded by a filler disposed in regions between sidewalls of the core and sidewalls of the electronic component.

Aspect 5. The substrate of aspect 4, wherein the filler comprises a dielectric material.

Aspect 6. The substrate of aspect 5, wherein: the dielectric material of the filler comprises a same dielectric material as one or more dielectric layers of the upper metallization structure.

Aspect 7. The substrate of any of aspects 1 to 6, wherein: the upper metal terminals of the upper metallization structure are further configured to provide an electrical connection to an electronic package mounted on the substrate.

Aspect 8. The substrate of any of aspects 1 to 7, wherein the one or more conductive paths comprise: a first patterned metallization layer disposed on the upper planar surface of the core, wherein the first patterned metallization layer is electrically connected to the one or more electronic component terminals; and a plurality of further patterned metallization layers including metal vias disposed through one or more dielectric layers and configured to couple the first patterned metallization layer with the upper metal terminals of the upper metallization structure.

Aspect 9. The substrate of any of aspects 1 to 8, wherein: the core has a thickness that is greater than about 760 micrometers.

Aspect 10. The substrate of any of aspects 1 to 9, wherein: the core has a thickness that is greater than about 820 micrometers.

Aspect 11. The substrate of any of aspects 1 to 10, wherein: the core has a thickness that is greater than about 1240 micrometers.

Aspect 12. The substrate of any of aspects 1 to 11, wherein: the core has a thickness greater than a height of the electronic component.

Aspect 13. The substrate of any of aspects 1 to 12, wherein: the upper metallization structure comprises one or more dielectric layers having patterned metallization layers respectively disposed over each dielectric layer of the one or more dielectric layers.

Aspect 14. The substrate of any of aspects 1 to 13, wherein: the electronic component comprises at least one deep trench capacitor.

Aspect 15. An electronic device, comprising: a substrate including a core having an upper planar surface and an interior planar surface; a cavity extending at least partially through the upper planar surface of the core to the interior planar surface of the core; an electronic component in the cavity, the electronic component including an upper planar surface having one or more electronic component terminals, wherein the electronic component is supported by the interior planar surface of the core so that the upper planar surface of the electronic component is level with the upper planar surface of the core; and an upper metallization structure configured to provide one or more conductive paths from the one or more electronic component terminals to one or more upper metal terminals of the upper metallization structure.

Aspect 16. The electronic device of aspect 15, further comprising: an electronic circuit package mounted on the substrate and electrically connected to the one or more upper metal terminals of the upper metallization structure.

Aspect 17. The electronic device of any of aspects 15 to 16, wherein the electronic device comprises at least one of: a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, an internet of things (IoT) device, or a device in an automotive vehicle.

Aspect 18. A method of forming a substrate, comprising: forming a cavity extending from an upper planar surface of a core to an interior planar surface of the core; inserting an electronic component in the cavity so that an upper planar surface of the electronic component having one or more electronic component terminals is supported by the interior planar surface of the core, wherein the electronic component is supported by the interior planar surface of the core so that the upper planar surface of the electronic component is level with the upper planar surface of the core; and forming an upper metallization structure over the upper planar surface of the core, wherein the upper metallization structure is configured to provide one or more conductive paths from the one or more electronic component terminals to one or more upper metal terminals of the upper metallization structure.

Aspect 19. The method of aspect 18, further comprising: forming the cavity to have a stepped cross-section.

Aspect 20. The method of any of aspects 18 to 19, further comprising: forming an adhesive layer between the interior planar surface of the core and the lower planar surface of the electronic component, wherein the adhesive layer has a thickness so that the upper planar surface of the electronic component is level with the upper planar surface of the core.

Aspect 21. The method of any of aspects 18 to 20, further comprising: forming a filler in regions between sidewalls of the core and sidewalls of the electronic component.

Aspect 22. The method of aspect 21, wherein the filler comprises a dielectric material.

Aspect 23. The method of aspect 22, wherein: the dielectric material of the filler comprises a same dielectric material as one or more dielectric layers of the upper metallization structure.

Aspect 24. The method of any of aspects 18 to 23, wherein forming the upper metallization structure comprises: configuring the upper metal terminals of the upper metallization structure for an electrical connection to an electronic package.

Aspect 25. The method of any of aspects 18 to 24, wherein forming the upper metallization structure comprises: forming a first patterned metallization layer on the upper planar surface of the core, wherein the first patterned metallization layer is electrically connected to the one or more electronic component terminals; forming a plurality of further patterned metallization layers forming metal vias through one or more dielectric layers; and connecting the first patterned metallization layer with the upper metal terminals of the upper metallization structure.

Aspect 26. The method of any of aspects 18 to 25, wherein: the core has a thickness that is greater than about 760 micrometers.

Aspect 27. The method of any of aspects 18 to 26, wherein: the core has a thickness that is greater than about 820 micrometers.

Aspect 28. The method of any of aspects 18 to 27, wherein: the core has a thickness that is greater than about 1240 micrometers.

Aspect 29. The method of any of aspects 18 to 28, wherein: the core has a thickness greater than a height of the electronic component.

Aspect 30. The method of any of aspects 18 to 29, wherein: the electronic component comprises at least one deep trench capacitor.

It is noted that the figures in the disclosure may represent actual representations and/or conceptual representations of various parts, components, objects, devices, packages, integrated devices, integrated circuits, and/or transistors. In some instances, the figures may not be to scale. In some instances, for the purpose of clarity, not all components and/or parts may be shown. In some instances, the position, the location, the sizes, and/or the shapes of various parts and/or components in the figures may be exemplary. In some implementations, various components and/or parts in the figures may be optional.

The word "exemplary" is used herein to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling (e.g., mechanical coupling) between two objects. For example, if object A physically touches object B, and object B touches object C, then objects A and C may still be considered coupled to one another—even if they do not directly physically touch each other. The term "electrically coupled" may mean that two objects are directly or indirectly coupled together such that an electrical current (e.g., signal, power, ground) may travel between the two objects. Two objects that are electrically coupled may or may not have an electrical current traveling between the two objects. The use of the terms "first", "second", "third" and "fourth" (and/or anything above fourth) is arbitrary. Any of the components described may be the first component, the second component, the third component or the fourth component. For example, a component that is referred to a second component, may be the first component, the second component, the third component or the fourth component. The term "encapsulating" means that the object may partially encapsulate or completely encapsulate another object. The terms "top" and "bottom" are arbitrary. A component that is located on top may be located over a component that is located on the bottom. A top component may be considered a bottom component, and vice versa. As described in the disclosure, a first component that is located "over" a second component may mean that the first component is located above or below the second component, depending on how a bottom or top is arbitrarily defined. In another example, a first component may be located over (e.g., above) a first surface of the second component, and a third component may be located over (e.g., below) a second surface of the second component, where the second surface is opposite to the first surface. It is further noted that the term "over" as used in the present application in the context of one component located over another component, may be used to mean a component that is on another component and/or in another component (e.g., on a surface of a component or embedded in a component). Thus, for example, a first component that is over the second component may mean that (1) the first component is over the second component, but not directly touching the second component, (2) the first component is on (e.g., on a surface of) the second component, and/or (3) the first component is in (e.g., embedded in) the second component. A first component that is located "in" a second component may be partially located in the second component or completely located in the second component. The term "about 'value X'", or "approximately value X", as used in the disclosure means within 10 percent of the 'value X'. For example, a value of about 1 or approximately 1, would mean a value in a range of 0.9-1.1.

In some implementations, an interconnect is an element or component of a device or package that allows or facilitates an electrical connection between two points, elements and/or components. In some implementations, an interconnect may include a trace, a via, a pad, a pillar, a metallization layer, a redistribution layer, and/or an under bump metallization (UBM) layer/interconnect. In some implementations, an interconnect may include an electrically conductive material that may be configured to provide an electrical path for a signal (e.g., a data signal), ground and/or power. An interconnect may include more than one element or component. An interconnect may be defined by one or more interconnects. An interconnect may include one or more metallization layers. An interconnect may be part of a circuit. Different implementations may use different processes and/or sequences for forming the interconnects. In some implementations, a chemical vapor deposition (CVD) process, a physical vapor deposition (PVD) process, a sputtering process, a spray coating, and/or a plating process may be used to form the interconnects.

Also, it is noted that various disclosures contained herein may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed.

In the detailed description above, it can be seen that different features are grouped together in examples. This manner of disclosure should not be understood as an intention that the example aspects have more features than are explicitly mentioned in each aspect. Rather, the various aspects of the disclosure may include fewer than all features of an individual example aspect disclosed. Therefore, the following aspects should hereby be deemed to be incorporated in the description, wherein each aspect by itself can stand as a separate example. Although each dependent aspect can refer in the aspects to a specific combination with one of the other aspects, the aspect(s) of that dependent aspect are not limited to the specific combination. It will be appreciated that other example aspects can also include a combination of the dependent aspect(s) with the subject matter of any other dependent aspect or independent aspect or a combination of any feature with other dependent and independent aspects. The various aspects disclosed herein expressly include these combinations, unless it is explicitly expressed or can be readily inferred that a specific combination is not intended (e.g., contradictory aspects, such as defining an element as both an electrical insulator and an electrical conductor). Furthermore, it is also intended that aspects of an aspect can be included in any other independent aspect, even if the aspect is not directly dependent on the independent aspect.

While the foregoing disclosure shows illustrative aspects of the disclosure, it should be noted that various changes and modifications could be made herein without departing from the scope of the disclosure as defined by the appended claims. The functions, steps and/or actions of the method claims in accordance with the aspects of the disclosure described herein need not be performed in any particular order. Furthermore, although elements of the disclosure may be described or claimed in the singular, the plural is contemplated unless limitation to the singular is explicitly stated.

What is claimed is:

1. A package substrate, comprising:
a non-conductive core having an upper planar surface;
a cavity extending at least partially through the upper planar surface of the non-conductive core to an interior planar surface of the non-conductive core, wherein the cavity is defined by a plurality of interior sidewalls of the non-conductive core extending from the interior planar surface of the non-conductive core to the upper planar surface of the non-conductive core;
a deep trench capacitor (DTC) mounted in the cavity, wherein the DTC is a stand-alone capacitor die having a semiconductor body including an upper planar surface having one or more terminals, a lower planar surface, and a plurality of exterior sidewalls extending between the lower planar surface of the DTC and the upper planar surface of the DTC, wherein the lower planar surface of the DTC is supported by the interior planar surface of the non-conductive core via an adhesive layer so that the upper planar surface of the DTC is level with the upper planar surface of the non-conductive core;
wherein the adhesive layer is disposed between the interior planar surface of the non-conductive core and the lower planar surface of the DTC, the adhesive layer extending along the interior planar surface of the non-conductive core beyond the plurality of exterior sidewalls of the DTC; and
an upper metallization structure configured to provide one or more conductive paths from the one or more terminals of the DTC to one or more upper metal terminals of the upper metallization structure, wherein the adhesive layer isolates the semiconductor body and the plurality of exterior sidewalls of the DTC from electrical contact with the interior planar surface and the plurality of interior sidewalls of the cavity.

2. The package substrate of claim 1, wherein:
the cavity has a stepped cross-section.

3. The package substrate of claim 1, wherein:
the adhesive layer has a thickness to place the upper planar surface of the DTC level with the upper planar surface of the non-conductive core.

4. The package substrate of claim 1, wherein:
the adhesive layer further extends upward from the interior planar surface of the non-conductive core to fill regions between the plurality of interior sidewalls of the non-conductive core and the plurality of exterior sidewalls of the DTC.

5. The package substrate of claim 1, further comprising:
a dielectric material overlying the adhesive layer and extending between the plurality of interior sidewalls of the cavity and the plurality of exterior sidewalls of the DTC.

6. The package substrate of claim 5, wherein:
the dielectric material comprises a same dielectric material as one or more dielectric layers of the upper metallization structure.

7. The package substrate of claim 1, wherein:
the upper metal terminals of the upper metallization structure are further configured to provide an electrical connection to an electronic package mounted on the package substrate.

8. The package substrate of claim 1, wherein the one or more conductive paths comprise:
a first patterned metallization layer disposed on the upper planar surface of the non-conductive core, wherein the first patterned metallization layer is electrically connected to the one or more terminals; and
a plurality of further patterned metallization layers including metal vias disposed through one or more dielectric layers and configured to couple the first patterned metallization layer with the upper metal terminals of the upper metallization structure.

9. The package substrate of claim 1, wherein:
the non-conductive core has a thickness that is greater than about 760 micrometers.

10. The package substrate of claim 1, wherein:
the non-conductive core has a thickness that is greater than about 820 micrometers.

11. The package substrate of claim 1, wherein:
the non-conductive core has a thickness that is greater than about 1240 micrometers.

12. The package substrate of claim 1, wherein:
the non-conductive core has a thickness greater than a height of the DTC.

13. The package substrate of claim 1, wherein:
the upper metallization structure comprises one or more dielectric layers having patterned metallization layers respectively disposed over each dielectric layer of the one or more dielectric layers.

14. An electronic device, comprising:
a package substrate comprising:
a non-conductive core having an upper planar surface;
a cavity extending at least partially through the upper planar surface of the non-conductive core to an interior planar surface of the non-conductive core, the cavity defined by a plurality of interior sidewalls of the non-conductive core extending from the interior planar surface of the non-conductive core to the upper planar surface of the non-conductive core;

a deep trench capacitor (DTC) mounted in the cavity, wherein the DTC is a stand-alone capacitor die having a semiconductor body including an upper planar surface having one or more terminals, a lower planar surface, and a plurality of exterior sidewalls extending between the lower planar surface of the DTC and the upper planar surface of the DTC, wherein the lower planar surface of the DTC is supported by the interior planar surface of the non-conductive core via an adhesive layer so that the upper planar surface of the DTC is level with the upper planar surface of the non-conductive core;
wherein the adhesive layer is disposed between the interior planar surface of the non-conductive core and the lower planar surface of the DTC, the adhesive layer extending along the interior planar surface of the non-conductive core beyond the plurality of exterior sidewalls of the DTC; and
an upper metallization structure configured to provide one or more conductive paths from the one or more terminals of the DTC to one or more upper metal terminals of the upper metallization structure, wherein the adhesive layer isolates the semiconductor body and the plurality of exterior sidewalls of the DTC from electrical contact with the interior planar surface and the plurality of interior sidewalls of the cavity.

15. The electronic device of claim 14, wherein:
the adhesive layer further extends upward from the interior planar surface of the non-conductive core to fill regions between the plurality of interior sidewalls of the non-conductive core and the plurality of exterior sidewalls of the DTC.

16. The electronic device of claim 14, wherein the electronic device comprises at least one of:
a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, an internet of things (IoT) device, or a device in an automotive vehicle.

17. A method of forming a package substrate, comprising:
forming a cavity extending from an upper planar surface of a non-conductive core to an interior planar surface of the non-conductive core, wherein the cavity is defined by a plurality of interior sidewalls of the non-conductive core extending from the interior planar surface of the non-conductive core to the upper planar surface of the non-conductive core;
inserting a deep trench capacitor (DTC) in the cavity, wherein the DTC is a stand-alone capacitor die having a semiconductor body including an upper planar surface having one or more terminals, a lower planar surface, and a plurality of exterior sidewalls extending between the lower planar surface of the DTC and the upper planar surface of the DTC, wherein the lower planar surface of the DTC is supported via an adhesive layer by the interior planar surface of the non-conductive core so that the upper planar surface of the DTC is level with the upper planar surface of the non-conductive core;
forming the adhesive layer between the interior planar surface of the non-conductive core and the lower planar surface of the DTC, the adhesive layer extending along the interior planar surface of the non-conductive core beyond the plurality of exterior sidewalls of the DTC; and forming an upper metallization structure over the upper planar surface of the non-conductive core, wherein the upper metallization structure is configured to provide one or more conductive paths from the one or more terminals of the DTC to one or more upper metal terminals of the upper metallization structure, wherein the adhesive layer isolates the semiconductor body and the plurality of exterior sidewalls of the DTC from electrical contact with the interior planar surface and the plurality of interior sidewalls of the cavity.

18. The method of claim 17, further comprising:

forming the cavity to have a stepped cross-section.

19. The method of claim 17, further comprising:

forming the adhesive layer between to have a thickness that places the upper planar surface of the DTC level with the upper planar surface of the non-conductive core.

20. The method of claim 17, further comprising:

forming the adhesive layer to extend upward from the interior planar surface of the non-conductive core to fill regions between the plurality of interior sidewalls of the non-conductive core and the plurality of exterior sidewalls of the DTC.

21. The method of claim 20, further comprising:

forming a non-conductive material overlying the adhesive layer and extending between the plurality of interior sidewalls of the cavity and the plurality of exterior sidewalls of the DTC.

22. The method of claim 21, wherein:

the dielectric material comprises a same dielectric material as one or more dielectric layers of the upper metallization structure.

23. The method of claim 17, wherein forming the upper metallization structure comprises:

configuring the upper metal terminals of the upper metallization structure for an electrical connection to a further electronic package.

24. The method of claim 17, wherein forming the upper metallization structure comprises:

forming a first patterned metallization layer on the upper planar surface of the non-conductive core, wherein the first patterned metallization layer is electrically connected to the one or more terminals;

forming a plurality of further patterned metallization layers forming metal vias through one or more dielectric layers; and connecting the first patterned metallization layer with the upper metal terminals of the upper metallization structure.

25. The method of claim 17, wherein:

the non-conductive core has a thickness that is greater than about 760 micrometers.

26. The method of claim 17, wherein:

the non-conductive core has a thickness that is greater than about 820 micrometers.

27. The method of claim 17, wherein:

the non-conductive core has a thickness that is greater than about 1240 micrometers.

28. The method of claim 17, wherein:

the non-conductive core has a thickness greater than a height of the DTC.

* * * * *